United States Patent
Holma et al.

(10) Patent No.: US 9,105,173 B2
(45) Date of Patent: Aug. 11, 2015

(54) ASSEMBLY WITH CONDITION MONITORING AND A METHOD FOR CONDITION MONITORING

(71) Applicant: TELLABS OY, Espoo (FI)

(72) Inventors: Antti Matias Holma, Espoo (FI); Petri Kohonen, Vantaa (FI)

(73) Assignee: CORIANT OY, Espoo (FI)

( * ) Notice: Subject to any disclaimer, the term of this patent is extended or adjusted under 35 U.S.C. 154(b) by 246 days.

(21) Appl. No.: 13/771,176

(22) Filed: Feb. 20, 2013

(65) Prior Publication Data

US 2013/0214929 A1     Aug. 22, 2013

(30) Foreign Application Priority Data

Feb. 20, 2012   (FI) ..................... 20125191

(51) Int. Cl.
| | | |
|---|---|---|
| H05K 7/20 | (2006.01) | |
| G08B 21/18 | (2006.01) | |
| G01R 31/04 | (2006.01) | |
| G01R 27/20 | (2006.01) | |

(52) U.S. Cl.
CPC ................ G08B 21/18 (2013.01); G01R 31/04 (2013.01); G01R 27/205 (2013.01)

(58) Field of Classification Search
CPC ...................................... H05K 7/20
USPC ........... 340/635, 687; 307/149; 324/421, 537, 324/763, 765; 361/1, 703, 711, 720, 722, 361/748, 760, 763, 767, 803, 831, 719
See application file for complete search history.

(56) References Cited

U.S. PATENT DOCUMENTS

| | | | |
|---|---|---|---|
| 5,019,940 A * | 5/1991 | Clemens ........................ | 361/723 |
| 6,097,203 A | 8/2000 | Parker et al. | |
| 6,160,402 A | 12/2000 | Naglich et al. | |
| 2003/0025518 A1 | 2/2003 | Berkely | |
| 2004/0257090 A1 | 12/2004 | Barr et al. | |
| 2008/0144243 A1 | 6/2008 | Mariani et al. | |
| 2010/0165579 A1 * | 7/2010 | Li et al. ......................... | 361/719 |
| 2010/0290194 A1 * | 11/2010 | Wu ................................ | 361/719 |

FOREIGN PATENT DOCUMENTS

EP          1414066 A1     4/2004

* cited by examiner

*Primary Examiner* — Brent Swarthout
(74) *Attorney, Agent, or Firm* — Young & Thompson

(57) ABSTRACT

An assembly that is provided with condition monitoring includes a first element having two or more electrically conductive contact members (102-105), a second (106) element attached to the two or more electrically conductive contact members and providing galvanic connections between the contact members. The assembly further includes a monitoring circuit (120) for monitoring electrical conductivities of the galvanic connections and for generating an indicator signal in response to a situation in which the electrical conductivity of one or more of the galvanic connections is lower than a threshold. When the joint between the first and second elements is totally or partially out of order, the electrical conductivity of one or more of the galvanic connections is low or zero and thus the indicator signal is generated. Therefore, the condition of the joint can be electrically monitored.

12 Claims, 4 Drawing Sheets

ASSEMBLY WITH CONDITION MONITORING AND A METHOD FOR CONDITION MONITORING

FIELD OF THE INVENTION

The invention relates generally to condition monitoring of a joint between mechanically connected elements. More particularly, the invention relates to an assembly provided with condition monitoring and to a method for condition monitoring of a joint between mechanically connected elements. Furthermore, the invention relates to an electronic device provided with condition monitoring.

BACKGROUND

In conjunction with many devices there is a need to monitor the condition of joints between different elements of a device. For example, the device may comprise a circuit board, an electronic component, such as e.g. an integrated circuit, on the surface of the circuit board, and a cooling element that is pressed against the electronic component so that the electronic component is between the circuit board and the cooling element. A typical mechanical structure for pressing the cooling element against the electronic component comprises bolts or other threaded rods and nuts attached to the circuit board so that the required pressing force is generated by tightening the bolts or other threaded rod to the nuts. The integration level of modern electrical devices is often so high that it is not possible to provide the circuit board with through holes for the above-mentioned bolts. Therefore, in many cases, the above-mentioned nuts are surface mounted devices "SMD" in order to avoid the need for holes through the circuit board. However, the joint between the circuit board and the SMD-nut should be very reliable or at least its condition should be monitored because loosening of the joint leads to a situation in which the thermal conductivity of the contact between the electronic component and the cooling element decreases and, as a corollary, the cooling is weakened and the electronic component may be overheated and finally destroyed. Thus, it is important to get an alarm already at an early stage when a fault in the joint between the SMD-nut and the circuit board is evolving. Another example, where condition monitoring of a joint between elements is applicable, is indication of unauthorized opening of a casing of a device. The indication may be used, for example, as a proof that a warranty is void.

SUMMARY

The following presents a simplified summary in order to provide a basic understanding of some aspects of various invention embodiments. The summary is not an extensive overview of the invention. It is neither intended to identify key or critical elements of the invention nor to delineate the scope of the invention. The following summary merely presents some concepts of the invention in a simplified form as a prelude to a more detailed description of exemplifying embodiments of the invention.

In accordance with the first aspect of the invention, there is provided a new assembly provided with condition monitoring. The assembly according to the present invention comprises:
- a first element provided with two or more electrically conductive contact members,
- a second element attached to the two or more electrically conductive contact members, the second element comprising electrically conductive material providing one or more galvanic connections between the two or more electrically conductive contact members,
- a monitoring circuit for monitoring electrical conductivities of the one or more galvanic connections and for generating an indicator signal in response to a situation in which the electrical conductivity of one or more of the galvanic connections is lower than a threshold,
- an electronic component, and
- a cooling element, wherein:
- the first element is a circuit board,
- the two or more electrically conductive contact members are connection pads on a surface of the circuit board,
- the second element is soldered to the connection pads, and
- the second element constitutes a part of a mechanical structure arranged to press the cooling element against the electronic component and at least part of force due to the pressing of the cooling element against the electronic component is received by the soldering between the connection pads and the second elements.

When the joint between the first and second elements is totally or partially out of order, the electrical conductivity of one or more of the galvanic connections is low or zero and thus the indicator signal is generated. Therefore, the condition of the joint can be electrically monitored.

When the present invention is applied in electrical devices comprising circuit boards and SMD-components attached on the circuit boards, a significant advantage of the present invention is that the joints having the above-described condition monitoring can be built in conjunction with furnishing the circuit boards with the SMD-components.

In accordance with the second aspect of the invention, there is provided a new electronic device comprising:
- an assembly according to the invention, and
- a control circuit connected to the monitoring circuit of the assembly.

The control circuit is arranged to generate an alarm signal and/or deactivate the electronic device in response to a situation in which the monitoring circuit generates the indicator signal.

In accordance with the third aspect of the invention, there is provided a new method for condition monitoring of a joint between a first element and a second element, where the first element is provided with two or more electrically conductive contact members and the second element is attached to the two or more electrically conductive contact members and provides one or more galvanic connections between the two or more electrically conductive contact members. The method according to the invention comprises:
- monitoring electrical conductivities of the one or more galvanic connections, and
- generating an indicator signal in response to a situation in which the electrical conductivity of one or more of the galvanic connections is lower than a threshold, wherein the second element is a part of a mechanical structure arranged to press a cooling element against an electronic component, and the indicator signal is generated in response to a situation in which the joint between the first element and the second element gets totally or partially out of order.

A number of non-limiting exemplifying embodiments of the invention are described in accompanied dependent claims.

Various non-limiting exemplifying embodiments of the invention both as to constructions and to methods of operation, together with additional objects and advantages thereof, will be best understood from the following description of specific exemplifying embodiments when read in connection with the accompanying drawings.

The verb "to comprise" is used in this document as an open limitation that neither excludes nor requires the existence of unrecited features. The features recited in dependent claims are mutually freely combinable unless otherwise explicitly stated.

BRIEF DESCRIPTION OF THE FIGURES

The exemplifying embodiments of the invention and their advantages are explained in greater detail below in the sense of examples and with reference to the accompanying drawings, in which.

DESCRIPTION OF THE EXEMPLIFYING EMBODIMENTS

Figure 1A:
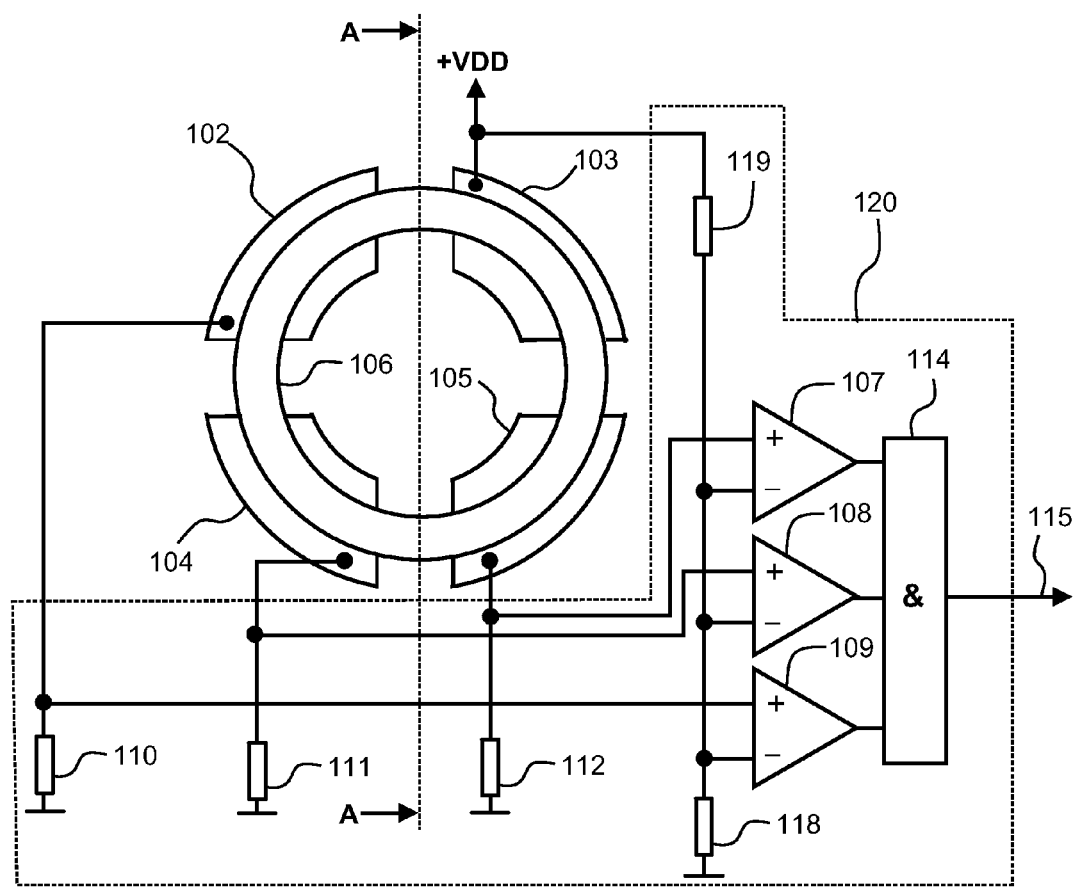
FIG. 1a shows a schematic illustration of an assembly according to an embodiment of the invention.
Figure 1B:
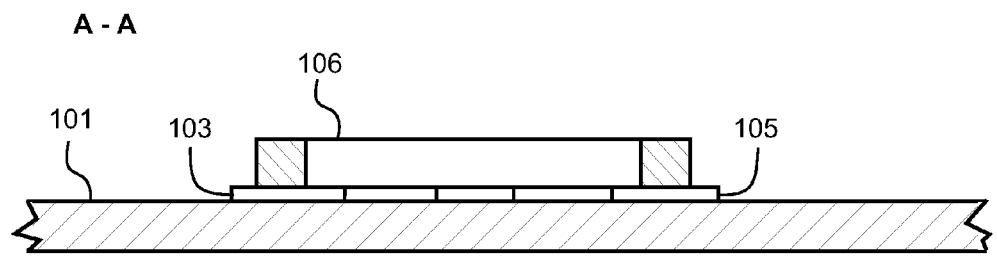
FIG. 1b shows the section taken along the line A-A shown in FIG. 1a, FIGS. 2a and 2b illustrate a part of an electronic device according to an embodiment of the invention.

FIG. 1a shows a schematic illustration of an assembly according to an embodiment of the invention and FIG. 1b shows the section taken along the line A-A shown in FIG. 1a. The assembly, which could be called also a system, comprises a first element 101 that is provided with electrically conductive contact members 102, 103, 104, and 105. The assembly comprises a second element 106 that is attached to the electrically conductive contact members 102-105. The second element 106 comprises electrically conductive material providing one or more galvanic connections between the electrically conductive contact members 102, 103, 104, and 105. For example, the second element 106 can be made of electrically conductive material, e.g. copper, or the surface of the second element that is against the electrically conductive contact members 102-105 may be coated with electrically conductive material. The assembly further comprises a monitoring circuit 120 for monitoring electrical conductivities of the one or more galvanic connections and for generating an indicator signal 115 in response to a situation in which the electrical conductivity of one or more of the galvanic connections is lower than a pre-determined threshold. The threshold can be determined by component values and/or configuration of the monitoring circuit 120.

In the exemplifying case shown in FIGS. 1a and 1b, the first element 101 is a circuit board and the electrically conductive contact members 102-105 are connection pads on a surface of the circuit board. The second element 106 is soldered to these connection pads. The electrically conductive contact member 103 is connected to a supply voltage +VDD. The electrically conductive contact members 102, 104, and 105 are connected to the ground via resistors 110, 111, and 112, respectively. The resistors 110, 111, and 112 are in series with the galvanic connections so that the resistor 110 is in series with the galvanic connection between the electrically conductive contact members 103 and 102, the resistor 111 is in series with the galvanic connection between the electrically conductive contact members 103 and 104, and the resistor 112 is in series with the galvanic connection between the electrically conductive contact members 103 and 105. The monitoring circuit 120 comprises comparators 107, 108, and 109 and the above-mentioned resistors 110-112. The comparators 107-109 are arranged to compare the voltages of the resistors 110-112 with reference voltage that is produced by voltage division from the supply voltage +VDD. In this exemplifying case, the threshold value for the electrical conductivity of the galvanic connections can be determined by selecting suitable values for the voltage division resistors 118 and 119 and for the resistors 110-112. The monitoring circuit 120 further comprises an AND-circuit 114 arranged to combine the output signals of the comparators 107-109. When voltage loss over an electrical contact between the second element 106 and any of the electrically conductive contact members 102-105 exceeds a certain value, the output signal of at least one of the comparators 107-109 drops down and thus also the output signal of the AND-circuit 114 drops down. Hence, in this exemplifying case, a low or zero value of the output signal of the AND-circuit 114 represents the indicator signal 115.

Figure 2A:
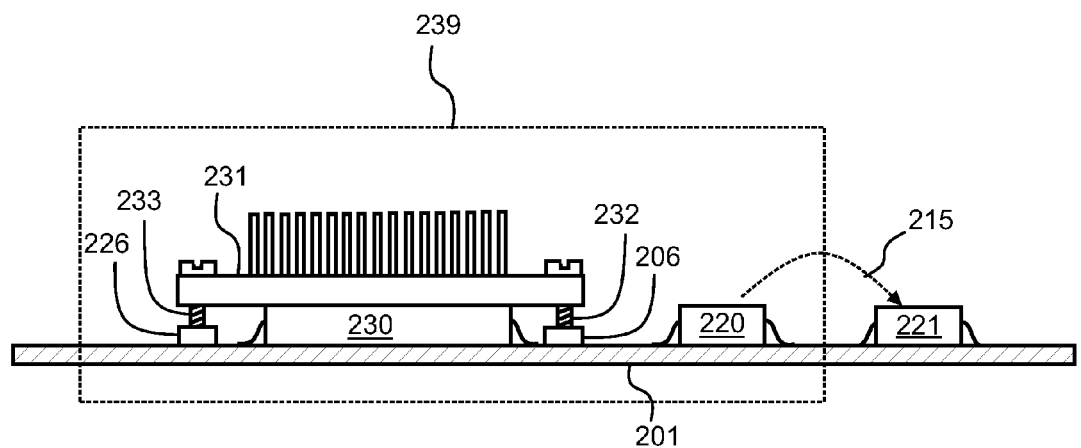
Figure 2B:
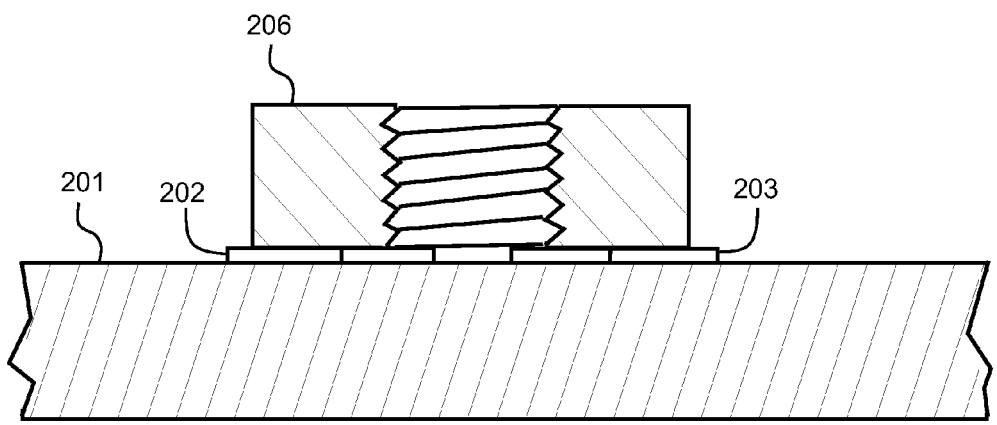

FIGS. 2a and 2b illustrate a part of an electronic device according to an embodiment of the invention. The electronic device comprises an assembly 239 of the kind described above and a control circuit 221 connected to the assembly. The assembly 239 comprises a first element 201 and second elements. The second elements 206 and 226 are shown in FIG. 2a, and there are two or more other second elements which are not shown in FIG. 2a. The first element 201 has electrically conductive contact members so that each of the second elements is attached to two or more of the electrically conductive contact members. Each of the second elements comprises electrically conductive material providing one or more galvanic connections between the two or more electrically conductive contact members attached to concerned second element. FIG. 2b shows a magnified section view of the second element 206 and of a part of the first element 201. FIG. 2b shows also the electrically conductive contact members 202 and 203 which are galvanically connected to each other via the second element 206. Each second element is an SMD-nut provided with a threaded hole and each second element constitutes a part of a mechanical structure arranged to press the cooling element 231 against the electronic component 230. The above-mentioned mechanical structure further comprises threaded rods tightened to the SMD-nuts so as to provide force pressing the cooling element 231 against the electronic component 230. The threaded rods 232 and 233 are shown in FIG. 2b. The threaded rods can be provided with screw or bolt heads as illustrated in FIG. 2a, or there can be ordinary nuts instead of the screw or bolt heads. Advantageously, there are spring washers or other resilient elements between the cooling element 231 and the screw or bolt heads or the nuts.

When the cooling element 231 is pressed against the electronic component 230 by tightening the treaded rods 232, 233 to the SMD-nuts, stretching forces are acting in the threaded rods and these forces tend to separate the SMD-nuts from the first element 201 and thereby to weaken the electrical conductivities of the galvanic connections provided by the SMD-nuts. The assembly 239 further comprises a monitoring circuit 220 for monitoring the electrical conductivities of these galvanic connections. The monitoring circuit 220 is arranged to generate an indicator signal 215 in response to a situation in which the electrical conductivity of one or more of the galvanic connections is lower than a threshold. The monitoring circuit can be based, for example, on the principle illustrated in FIG. 1a. The control circuit 221 is arranged to generate an alarm signal and/or deactivate the electronic device in response to a situation in which the monitoring circuit 220 generates the indicator signal 215. In a situation in which one or more of the joints between the first element 201 and the SMD-nuts loosen so that one or more of the respective galvanic connections are weakened so much that the electrical conductivities of these galvanic connections get below the threshold, the alarm signal is generated and/or the electronic device is deactivated. This helps to avoid situations in which the electrical component 230 is overheated because of weakened cooling caused by loosening of the mechanical contact between the electrical component 230 and the cooling element 231.

In the exemplifying case illustrated in FIGS. 2a and 2b, the first element 201 is a circuit board, the electrically conductive contact members of the first element are connection pads on the surface of the circuit board, and the second elements, i.e. the SMD-nuts, are preferably soldered to the connection pads. It should be however noted, that these are not the only possible choices. For example, the second element could be bolts whose heads are attached to the surface of the first element.

Figure 3:
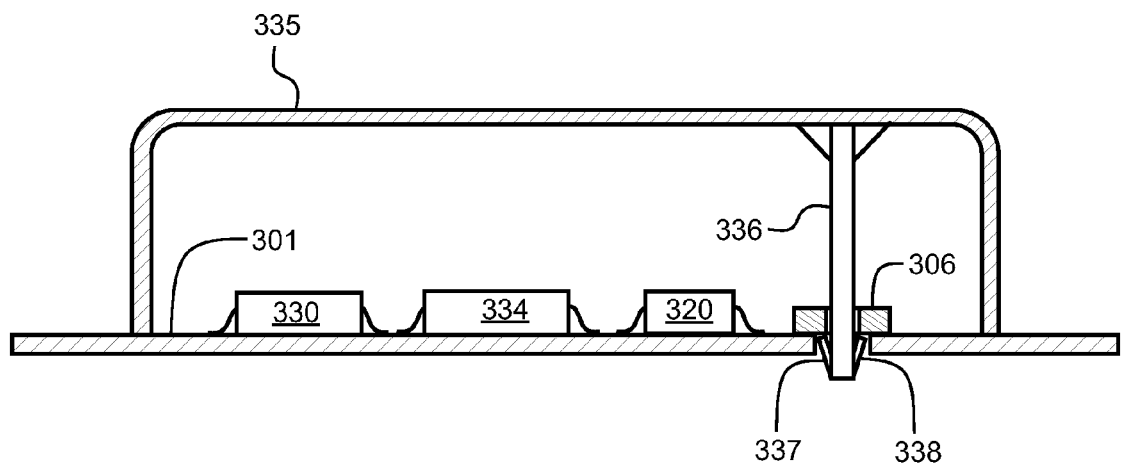
FIG. 3 shows a schematic section view of a part of an electronic device according to an embodiment of the invention.

FIG. 3 shows a schematic section view of a part of an electronic device according to an embodiment of the invention. The electronic device comprises an assembly comprising:
- a first element 301 provided with two or more electrically conductive contact members,
- a second element 306 attached to the two or more electrically conductive contact members and providing one or more galvanic connections between the two or more electrically conductive contact members, and
- a monitoring circuit 320 for monitoring electrical conductivities of the one or more galvanic connections and for generating an indicator signal in response to a situation in which the electrical conductivity of one or more of the galvanic connections is lower than a threshold.

In the exemplifying case illustrated in FIG. 3, the first element 301 is a circuit board, the two or more electrically conductive contact members are connection pads on a surface of the circuit board, and the second element 306 is preferably soldered to the connection pads. The assembly further comprises a case 335 whose rim is against the circuit board and which together with the circuit board delimits a three-dimensional room that contains electronic components 330 and 334, e.g. integrated circuits. The case is mechanically connected to the second element 306 so that the one or more galvanic connections are broken and, as a corollary, the indicator signal is generated in response to separating the case 335 from the circuit board. In this exemplifying embodiment of the invention, there is a through hole in the circuit board and also in the second element 306 as illustrated by the section view shown in FIG. 3. The case 335 comprises a rod 336 that is in the above-mentioned through holes and that comprises claws 337 and 338 so that the second member 306 gets detached from the circuit board when the case 335 is removed. Hence, for example unauthorized removal of the case 335 can be electrically detected.

Figure 4:
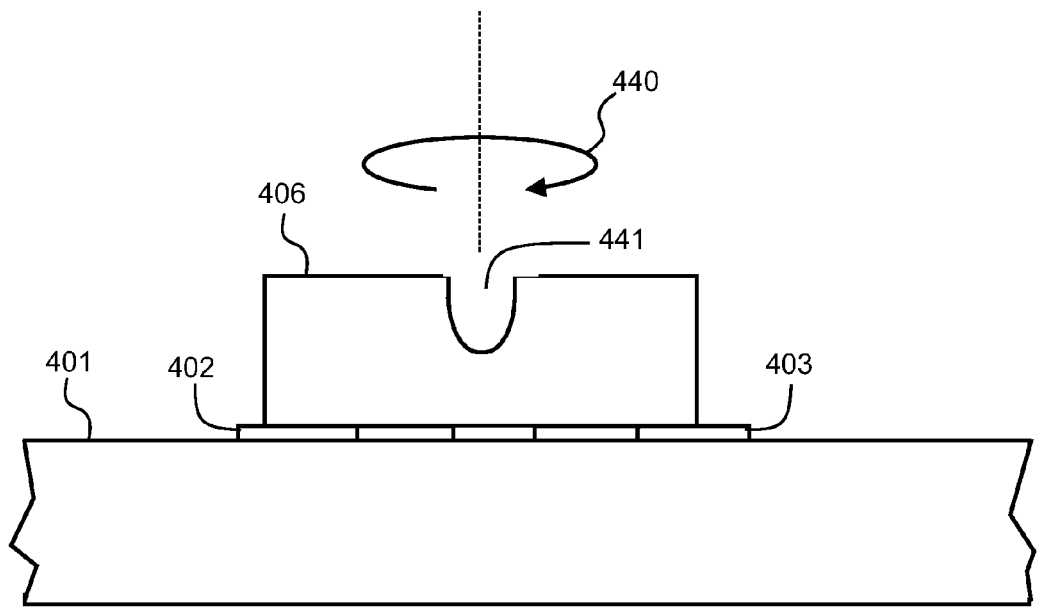
FIG. 4 shows a schematic illustration of a part of an assembly according to an embodiment of the invention.

FIG. 4 shows a schematic illustration of a part of an assembly according to an exemplifying embodiment of the invention. The assembly comprises:
- a first element 401 provided with two or more electrically conductive contact members 402 and 403,
- a second element 406 attached to the two or more electrically conductive contact members and providing one or more galvanic connections between the two or more electrically conductive contact members, and
- a monitoring circuit for monitoring electrical conductivities of the one or more galvanic connections and for generating an indicator signal in response to a situation in which the electrical conductivity of one or more of the galvanic connections is lower than a threshold.

The monitoring circuit is not shown in FIG. 4, but the monitoring circuit can be, for example, such as shown in FIG. 1a.

The second element 406 comprises a screw or bolt head for allowing the second element 406 to be rotated with respect to the first element 401 as illustrated by an arrow 440 shown in FIG. 4. In the exemplifying case illustrated in FIG. 4, the second element comprises a slot 441 so that the second element 406 can be rotated with an ordinary screw driver. When the second element is rotated, the one or more galvanic connections are broken and, as a corollary, the indicator signal is generated. The assembly shown in FIG. 4 can be located, for example, on an outer wall of a casing of an electrical device and it can be, for example, a non-reversible deactivator of the electrical device.

Figure 5:
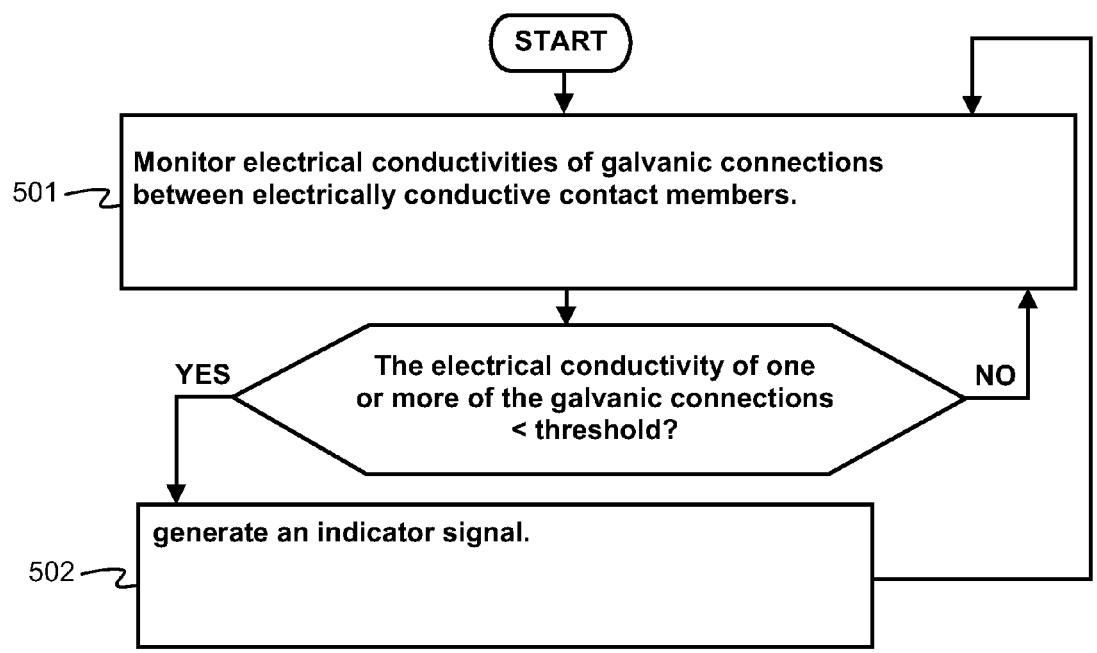
FIG. 5 shows a flowchart of a method according to an embodiment of the invention for condition monitoring of a joint between a first element and a second element.

FIG. 5 shows a flowchart of a method according to an embodiment of the invention for condition monitoring of a joint between a first element and a second element, the first element being provided with two or more electrically conductive contact members and the second element being attached to the two or more electrically conductive contact members and providing one or more galvanic connections between the two or more electrically conductive contact members. The method comprises the following actions:
- action 501: monitoring electrical conductivities of the one or more galvanic connections, and
- action 502: generating an indicator signal in response to a situation in which the electrical conductivity of one or more of the galvanic connections is lower than a threshold.

In a method according to an exemplifying embodiment of the invention, the second element is a part of a mechanical structure arranged to press a cooling element against an electronic component, and the indicator signal is generated in response to a situation in which the joint between the first element and the second element gets totally or partially out of order.

In a method according to an exemplifying embodiment of the invention, the joint between the first element and the second element is broken and the indicator signal is generated in response to opening a casing of an electronic device.

The specific examples provided in the description given above should not be construed as limiting the applicability and/or the interpretation of the appended claims.

What is claimed is:

1. An assembly comprising:
   a first element provided with two or more electrically conductive contact members;
   a second element attached to the two or more electrically conductive contact members;
   an electronic component; and
   a cooling element,
   wherein
   the second element comprises electrically conductive material providing one or more galvanic connections between the two or more electrically conductive contact members,
   the first element is a circuit board, the two or more electrically conductive contact members are connection pads on a surface of the circuit board, and the second element is soldered to the connection pads, the assembly further comprises a monitoring circuit for monitoring electrical conductivities of the one or more galvanic connections and for generating an indicator signal in response to a situation in which the electrical conductivity of the one or more of the galvanic connections is lower than a threshold, and the second element constitutes a part of a mechanical structure arranged to press the cooling element against the electronic component and at least part of force due to the pressing of the cooling element against the electronic component is received by the soldering between the connection pads and the second element.

2. The assembly according to claim 1, wherein the second element is a nut provided with a threaded hole and the mechanical structure arranged press the cooling element further comprises a threaded rod tightened to the nut so as to provide at least part of force pressing the cooling element against the electronic component.

3. The assembly according to claim 1, wherein the monitoring circuit comprises a resistor in series with one of the galvanic connections and a comparator for comparing voltage of the resistor with a reference voltage.

4. The assembly according to claim 2, wherein the monitoring circuit comprises a resistor in series with one of the galvanic connections and a comparator for comparing voltage of the resistor with a reference voltage.

5. An electronic device comprising:
a circuit board comprising two or more electrically conductive connection pads on a surface of the circuit board;
electrically conductive material soldered to the two or more electrically conductive connection pads and providing one or more galvanic connections between the two or more electrically conductive connection pads;
a monitoring circuit for monitoring electrical conductivities of the one or more galvanic connections and for generating an indicator signal in response to a situation in which the electrical conductivity of the one or more of the galvanic connections is lower than a threshold;
a control circuit connected to the monitoring circuit and arranged to carry out at least one of the following actions in response to a situation in which the monitoring circuit generates the indicator signal: deactivate the electronic device, generate an alarm signal,
an electronic component; and
a cooling element;
wherein the electrically conductive material constitutes a part of a mechanical structure arranged to press the cooling element against the electronic component and at least part of force due to the pressing of the cooling element against the electronic component is received by the soldering between the two or more electrically conductive connection pads and the electrically conductive material.

6. The electronic device according to claim 5, wherein the electronic device is at least one of the following: an internet protocol "IP" router, an Ethernet switch, a multiprotocol label switching "MPLS" switch.

7. A method for condition monitoring of a joint between a first element and a second element, the first element being provided with two or more electrically conductive contact members and the second element being soldered to the two or more electrically conductive contact members and providing one or more galvanic connections between the two or more electrically conductive contact members, the method comprising:
monitoring electrical conductivities of the one or more galvanic connections; and
generating an indicator signal in response to a situation in which the electrical conductivity of the one or more of the galvanic connections is lower than a threshold,
wherein the second element is a part of a mechanical structure arranged to press a cooling element against an electronic component, and the indicator signal is generated in response to a situation in which the joint between the first element and the second element gets totally or partially out of order.

8. The method according to claim 7, wherein the second element is a nut provided with a threaded hole and the mechanical structure arranged press the cooling element further comprises a threaded rod tightened to the nut so as to provide at least part of force pressing the cooling element against the electronic component.

9. The method according to claim 7, wherein a monitoring circuit comprises a resistor in series with one of the galvanic connections and a comparator for comparing voltage of the resistor with a reference voltage.

10. The method according to claim 8, wherein the monitoring circuit comprises a resistor in series with one of the galvanic connections and a comparator for comparing voltage of the resistor with a reference voltage.

11. The method according to claim 7, wherein the first element is a circuit board.

12. The method according to claim 11, wherein the electrically conductive contact members are connection pads on a surface of the circuit board.

* * * * *